United States Patent
Bhushan Singh et al.

(10) Patent No.: US 9,971,663 B2
(45) Date of Patent: May 15, 2018

(54) METHOD AND APPARATUS FOR MULTIPLE MEMORY SHARED COLLAR ARCHITECTURE

(71) Applicant: QUALCOMM Incorporated, San Diego, CA (US)

(72) Inventors: Nishi Bhushan Singh, Bangalore (IN); Anand Bhat, Bangalore (IN); Ashutosh Anand, Bangalore (IN); Rajesh Tiwari, Bangalore (IN); Abhinav Kothiala, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 90 days.

(21) Appl. No.: 14/671,558

(22) Filed: Mar. 27, 2015

(65) Prior Publication Data

US 2016/0062864 A1    Mar. 3, 2016

Related U.S. Application Data

(60) Provisional application No. 62/043,904, filed on Aug. 29, 2014.

(51) Int. Cl.
*G11C 29/00* (2006.01)
*G06F 11/27* (2006.01)
(Continued)

(52) U.S. Cl.
CPC .......... *G06F 11/27* (2013.01); *G11C 29/1201* (2013.01); *G11C 29/26* (2013.01); *G11C 8/12* (2013.01)

(58) Field of Classification Search
CPC ..... G06F 11/27; G11C 29/1201; G11C 29/26; G11C 8/12
(Continued)

(56) References Cited

U.S. PATENT DOCUMENTS

| 5,355,342 | A  | * | 10/1994 | Ueoka ................ | G11C 29/28 365/201 |
| 7,093,156 | B1 | * | 8/2006  | Shubat ............... | G11C 29/4401 365/200 |

(Continued)

OTHER PUBLICATIONS

Benso A.; Di Carlo S.; Di Natale G.; Prinetto P.; Lobetti Bodoni M. (2000). A programmable BIST architecture for clusters of Multiple-Port SRAMs. In: IEEE International Test Conference (ITC), Atlantic City (NJ), USA, Oct. 3-5, 2000. pp. 557-566.*

*Primary Examiner* — April Y Blair
*Assistant Examiner* — Rong Tang
(74) *Attorney, Agent, or Firm* — Loza & Loza LLP

(57) ABSTRACT

A method and apparatus for reducing memory built-in self-test (MBIST) area by optimizing the number of interfaces required for testing a given set of memories is provided. The method begins when memories of a same configuration are grouped together. One memory is then selected from each of the groups. MBIST insertion is then performed for a selected group of memories, and the selected group of memories contains memories of different configurations. Control logic is used to select each group of memories separately. The memory group under test may also be selected using programmable user bits. An apparatus is also provided. The apparatus includes: a controller, at least one memory interface in communication with the controller, at least one control logic cloud in communication with the at least one memory interface; and at least one bit bus.

6 Claims, 3 Drawing Sheets

(51) Int. Cl.
    *G11C 29/12*     (2006.01)
    *G11C 29/26*     (2006.01)
    *G11C 8/12*      (2006.01)

(58) Field of Classification Search
    USPC .......................... 714/718–723; 365/200–201
    See application file for complete search history.

(56) References Cited

U.S. PATENT DOCUMENTS

| | | | |
|---|---|---|---|
| 7,203,873 B1* | 4/2007 | Adams | G11C 29/1201 |
| | | | 714/31 |
| 7,237,175 B2* | 6/2007 | Hatakenaka | G06F 11/1012 |
| | | | 714/763 |
| 7,895,482 B2 | 2/2011 | Fischer et al. | |
| 8,108,744 B2* | 1/2012 | Dubey | G11C 29/1201 |
| | | | 714/718 |
| 8,386,864 B2 | 2/2013 | Dubey et al. | |
| 8,661,399 B1 | 2/2014 | Monroe et al. | |
| 8,719,761 B2* | 5/2014 | Card | G06F 17/505 |
| | | | 716/106 |

\* cited by examiner

METHOD AND APPARATUS FOR MULTIPLE MEMORY SHARED COLLAR ARCHITECTURE

CLAIM OF PRIORITY UNDER 35 U.S.C. § 119

The present application for patent claims priority to Provisional Application No. 62/043,904 entitled "METHOD AND APPARATUS FOR MULTIPLE MEMORIES SHARED COLLAR ARCHITECTURE" filed Aug. 29, 2014, and assigned to the assignee hereof and expressly incorporated by reference herein.

FIELD

The present disclosure relates generally to an architecture for testing multiple memories in a shared collar architecture.

BACKGROUND

Today's designs for system-on-chip (SoC) may have more than one hundred embedded memories on a single chip. These memories may be scattered around the device instead of being concentrated in one location. Typically, these memories are of different types and sizes. In addition, these memories may be further embedded inside embedded cores. This structure poses a challenge to testing all of the memories on the chips, as test access may be limited to only a few input/output (I/O) pins.

Built in self-test (BIST) is frequently used to test such embedded memories within SoCs, as it provides a simple and low cost method of testing that does not affect performance. Specific testing may be required to test all of the memories on a device, which is known as memory built-in self-test (MBIST). As SoCs are used ever more widely in devices, such as mobile phones, the challenge becomes offering increased performance while maintaining a portable device. As devices gain performance and functionality, the number of memories to support that functionality grows, as does the need to test those memories. This may lead to congestion at the MBIST controller as all data path routing must pass through the controller.

There is a need in the art for an architecture to reduce the amount of area required to provide MBIST functionality and also to reduce MBIST controller to data path routing congestion without affecting the quality of resilience (QoR) of the device.

SUMMARY

Embodiments contained in the disclosure provide a method for reducing memory built-in self-test (MBIST) area by optimizing the number of interfaces required for testing a given set of memories. The method begins when memories of a same configuration are grouped together. One memory is then selected from each of the groups. MBIST insertion is then performed for a selected group of memories, and the selected group of memories contains memories of different configurations. Control logic is used to select each group of memories separately. The memory group under test may also be selected using programmable user bits.

A further embodiment provides an apparatus for reducing MBIST area by optimizing the number of interfaces required for testing a given set of memories. The apparatus includes: a controller, at least one memory interface in communication with the controller, at least one control logic cloud in communication with at least one memory interface; and at least one bit bus.

A still further embodiment provides an apparatus for reducing MBIST area by optimizing the number of interfaces required for testing a given set of memories. The apparatus includes: means for grouping memories of a same configuration; means for selecting one memory from each group of memories of the same configuration; means for performing MBIST insertion for the selected group of memories; means for selecting each group of memories separately; and means for performing MBIST testing for each memory group.

An additional embodiment provides a non-transitory computer-readable medium containing instructions, which when executed, cause a processor to perform the following steps: grouping memories of a same configuration; selecting one memory from each group of memories of the same configuration; performing MBIST insertion for the selected group of memories; selecting each group of memories separately; and performing MBIST testing for each memory group.

DETAILED DESCRIPTION

Figure 1:
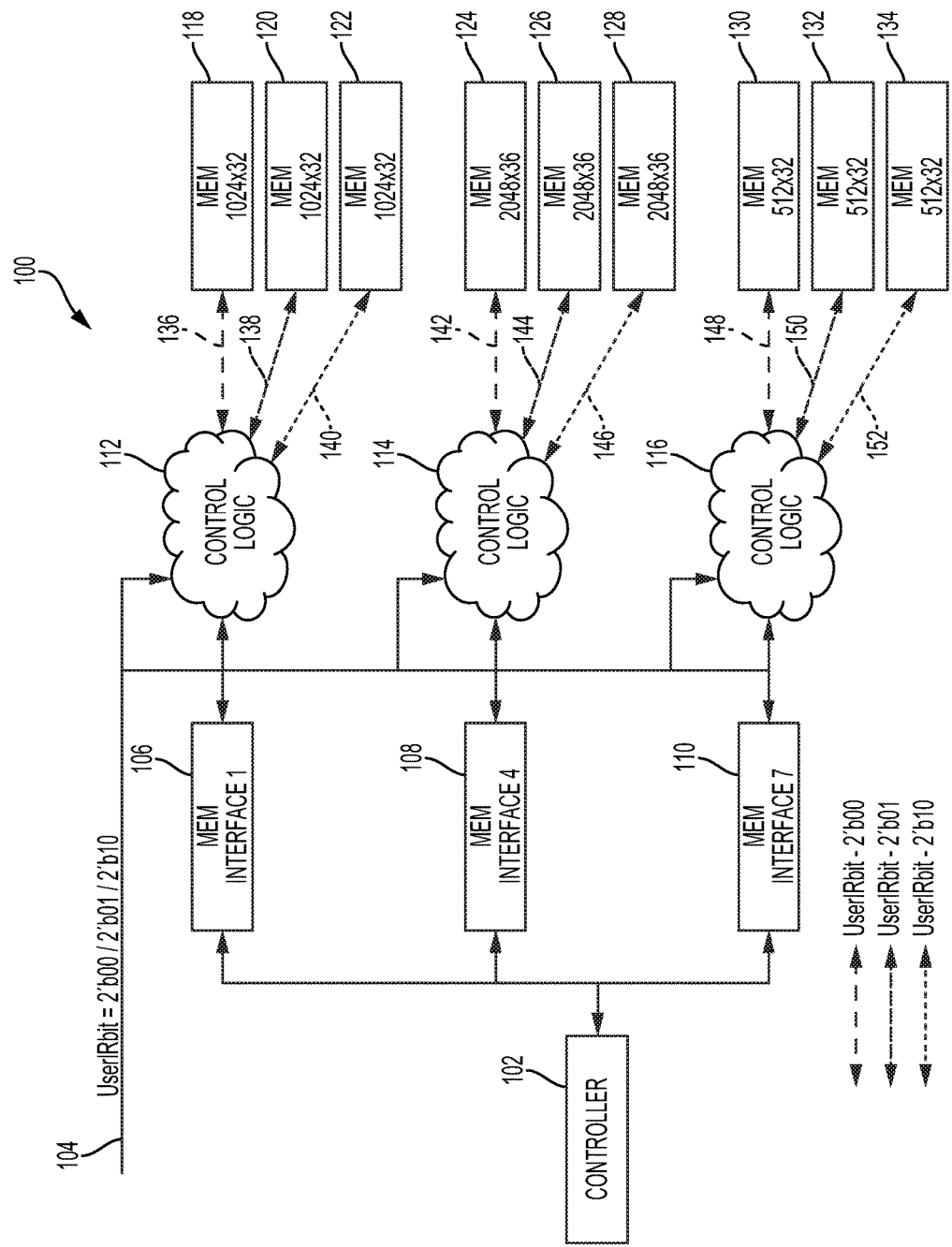
FIG. 1 depicts a MBIST architecture in accordance with embodiments described herein.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Furthermore, various aspects are described herein in connection with an access terminal and/or an access point. An access terminal may refer to a device providing voice and/or data connectivity to a user. An access wireless terminal may be connected to a computing device such as a laptop computer or desktop computer, or it may be a self-contained device such as a cellular telephone. An access terminal can also be called a system, a subscriber unit, a subscriber station, mobile station, mobile, remote station, remote terminal, a wireless access point, wireless terminal, user terminal, user agent, user device, or user equipment. A wireless terminal may be a subscriber station, wireless device, cellular telephone, PCS telephone, cordless telephone, a Session Initiation Protocol (SIP) phone, a wireless local loop (WLL) station, a personal digital assistant (PDA), a handheld device having wireless connection capability, or other processing device connected to a wireless modem. An access point, otherwise referred to as a base station or base station controller (BSC), may refer to a device in an access network that communicates over the air-interface, through one or more sectors, with wireless terminals. The access point may act as a router between the wireless terminal and the rest of the access network, which may include an Internet Protocol (IP) network, by converting received air-interface frames to IP packets. The access point also coordinates management of attributes for the air interface.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

MBIST testing provides a mechanism that allows a memory to test itself. MBIST may be used to ensure high reliability and to lower repair cycle times. MBIST may also be used in situations where technician accessibility is limited or it is necessary to reduce testing costs in the manufacturing process. Costs are reduced because MBIST reduces the time needed for memory testing and also reduces the complexity of the test set up. Often, the number of I/O signals that need to be examined are reduced.

A general BIST architecture provides a test generator that interfaces with the circuit under test. The circuit under test receives input from the test generator and outputs a response verification. A test controller is connected to the test generator and also to a response verification device. The test controller generates control signals for the test pattern. These control signals are provided to the test pattern generator and the memory under test. The test pattern generator generates the required test patterns and the Read/Write signals. The comparator evaluates the response of the memory to the test signals.

In some architectures the read-only memory (ROM) may store the test procedures for generating test patterns. The self-test is executed using the BIST circuits that are controlled by the microprogram ROM. This structure allows for a wide range of test capability due to the programming flexibility. This BIST circuit provides functional blocks for storing the microprogram to store the test procedure. In addition, the BIST circuits include a program counter for controlling the microprogram ROM, a test pattern generator, and a comparator.

Memory content in SoC devices has increased dramatically over the last few years. Increasingly, SoCs are moving from logic dominant chip to memory dominant chips. In some SoC designs embedded memories may occupy more the 50% of the die area of the chip. Both memory test logic area and test power have become major design challenges.

Current MBIST architecture has three main components: a test access port (TAP), a controller, and an interface. The total area required for MBIST is determined by the following formula:

$$\text{Total Area}=\text{TAP area}+N*\text{Controller area}+0.4*(\text{BIST Collars/Interface area})$$

This total area for MBIST provides a one-to-one interface between memories. As the number of memories increases, the percentage of total MBIST area taken by the data path/interface logic may increase to as much as 90% of the total MBIST area. As a result, many solutions focus on optimizing either the controller or the comparator logic.

FIG. 1 is a block diagram of a MBIST architecture 100, that addresses the difficulties enumerated above. A controller 102, interfaces with memory interfaces 106, 108, and 110. The architecture 100 is not limited to three memory interfaces, and may be expanded to include additional memory interfaces. In a similar fashion, the architecture may includes fewer then three memory interfaces. The memory interfaces (MEM) 106, 108, and 110 interact with the control logic, shown here as control logic clouds 112, 114, and 116. MEM interfaces 106, 108, and 110 act as a collar, with each MEM interface 106, 108, and 110 interacting with the control logic for a particular memory group. FIG. 1 depicts MEM interface 106 interacting with control logic cloud 112. MEM interface 108 interacts with control logic cloud 114, and MEM interface 110 interacts with control logic cloud 116.

A User IR bit bus 104 provides communication between MEM interfaces 106, 108, and 110 and control logic clouds 112, 114, and 116. Control logic cloud 112 communicates over User IR bit communication line 2'b00 136 with memory 118. Control logic cloud 112 similarly communicates with memory 120 over communication line 2'b01 138 and with memory 122 over communication line 2'b10 140. The architecture is similarly structured for control logic cloud 114 communicating with memory 124 over communication line 2'b00 142, memory 126 over communication line 2'b01 144, and memory 128 over communication line 2'b10 146. Control logic 116 communicates with memory 130 over communication line 2'b00 148, with memory 132 over communication line 2'b01 150, and with memory 134 over communication line 2'b10 152. Additional control logic lines may be added to handle additional memories beyond that depicted in FIG. 1.

Figure 2:
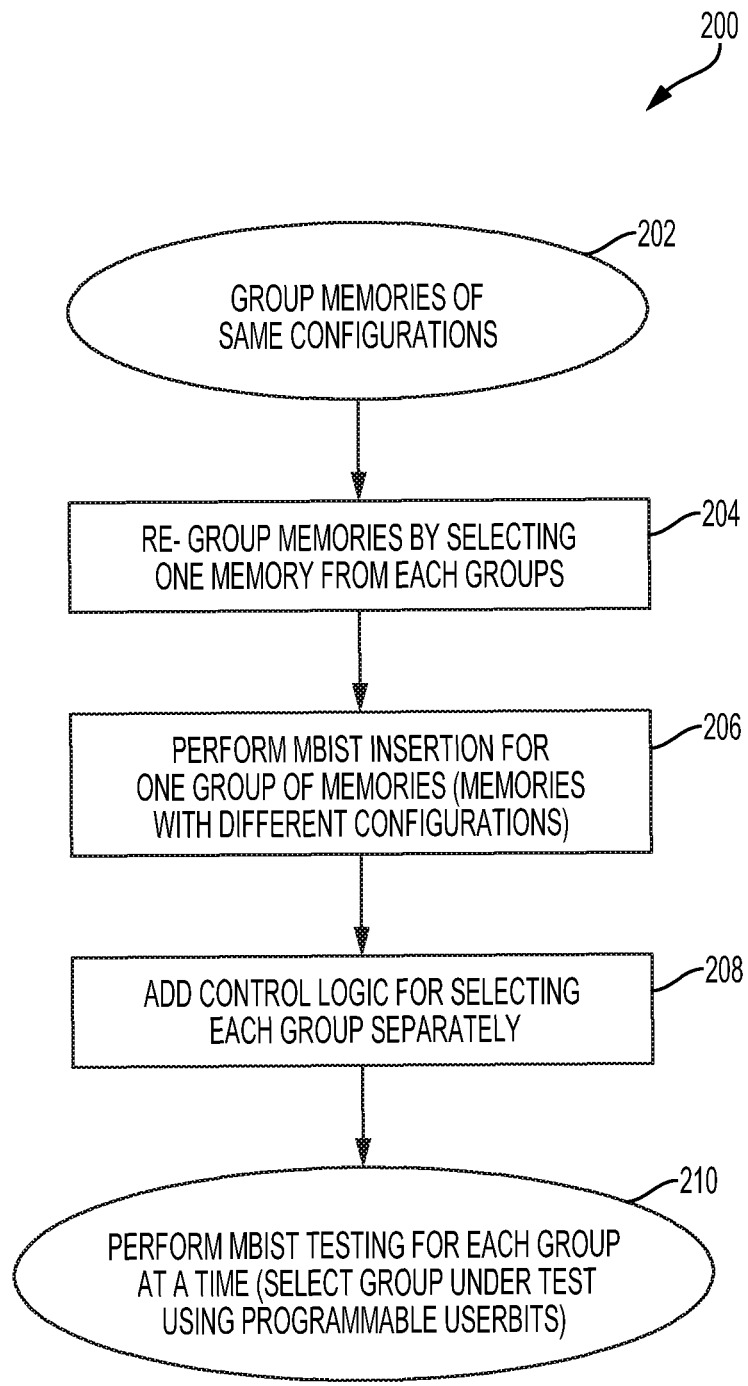
FIG. 2 is a flow chart of a method of MBIST testing in accordance with embodiments described herein.

FIG. 2 is a flow chart of a method of using the architecture of FIG. 1. The method 200 begins when the memories are grouped according to configuration, in step 202. Each memory group contains memories of the same configuration. Multiple memory groupings are anticipated in the process. In step 204 the memories are then re-grouped by selecting one memory from each of the configuration groups. MBIST insertion is then performed for one group of memories in step 206. Control logic for selecting each group separately is then added in step 208. In step 210 MBIST testing is performed for each group at a time. This operation includes selecting a group under test using programmable user bits. Testing for each subsequent group of memories is performed as described above until all necessary memory groups have been tested.

Figure 3:
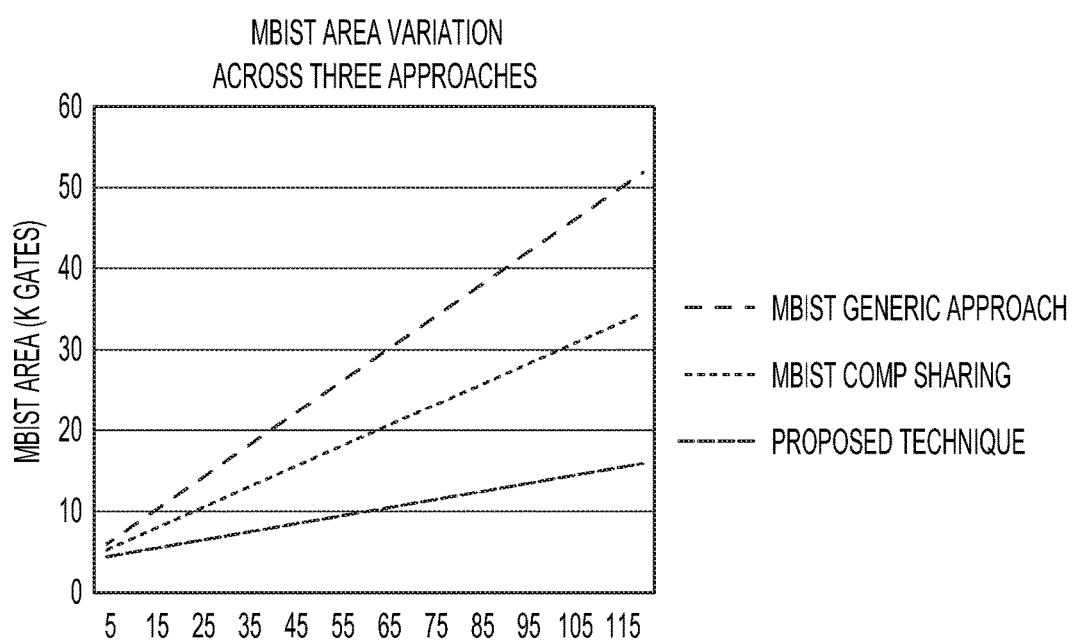
FIG. 3 illustrates a comparison of MBIST area reduction for three different approaches, in accordance with embodiments described herein.

FIG. 3 provides a graph illustrating the area savings using the architecture of FIG. 1. In FIG. 3 the area savings as a percentage is plotted as a function of the number of interfaces used in a generic approach. FIG. 3 illustrates the savings possible using the application technique described herein when compared with both a MBIST generic approach, and MBIST comparator sharing approaches. FIG. 3 shows that the architecture described herein reduces the number of interfaces necessary for MBIST testing to less than one-fourth the number required for a generic approach.

The generic approach requires the same number of memory comparators and data path logic, thus resulting in a high percentage of die area consumed by MBIST testing needs. Sharing the logic comparator may produce some improvement, however, such an approach does not reduce the number of memory data path logic lines or interface glue logic lines that are required. Using the architecture described herein produces a 75% reduction in the number of interface glue logic components needed. The area savings produced by the architecture described here may be computed by the following formula:

$$\text{Area savings}(\%) = \frac{30I}{(2.7 + N * 1.5 + 0.4I)}$$

where I is the number of interfaces and N is the number of clock domains.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method of reducing memory built-in self-test (MBIST) area by optimizing a number of memory interfaces, comprising:
   selecting memories of a same configuration to form an initial group of memories sharing a first configuration;

selecting other memories sharing a second configuration that is different from the first configuration to form another initial group of memories of the second configuration;

selecting one memory from each of the initial groups of memories to form a test memory group, wherein the test memory group contains one memory of each memory configuration;

repeating the selecting one memory from each of the initial groups of memories to form another test memory group until all memories have been placed in test memory groups;

performing MBIST insertion for one of the test memory groups;

selecting each of the test memory groups separately using programmable user bits, wherein the memory interfaces communicate with any one of the test memory groups at a time based on the programmable user bits; and performing MBIST testing for each of the test memory groups.

2. The method of claim 1, wherein the selecting each of the test memory groups separately is performed using control logic.

3. The method of claim 2, wherein the control logic is specific to each of the test memory groups.

4. An apparatus for reducing memory built-in self-test (MBIST) area by optimizing a number of memory interfaces, comprising:

means for selecting memories sharing a first configuration to form an initial group of memories of the first configuration;

means for selecting other memories of sharing a second configuration to form another initial group of memories of the second configuration;

means for selecting one memory from each of the initial groups of memories to form a test memory group, wherein the test memory group contains one memory of each memory configuration;

means for repeating the selecting one memory from each of the initial groups of memories to form another test memory group until all memories have been placed in test memory groups;

means for performing MBIST insertion for one of the test memory groups;

means for selecting each of the test memory groups separately using programmable user bits, wherein the memory interfaces communicate with any one of the test memory groups at a time based on the programmable user bits; and means for performing MBIST testing for each of the test memory groups.

5. The apparatus of claim 4, wherein the means for selecting each of the test memory groups separately uses control logic.

6. The apparatus of claim 4, wherein the means for selecting each of the test memory groups uses control logic specific to each of the test memory groups.

* * * * *